United States Patent
Gardner et al.

(10) Patent No.: US 6,265,749 B1
(45) Date of Patent: *Jul. 24, 2001

(54) METAL SILICIDE TRANSISTOR GATE SPACED FROM A SEMICONDUCTOR SUBSTRATE BY A CERAMIC GATE DIELECTRIC HAVING A HIGH DIELECTRIC CONSTANT

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/950,042

(22) Filed: Oct. 14, 1997

(51) Int. Cl.[7] .......................... H01L 29/76; H01L 29/94; H01L 31/062; H01L 29/00
(52) U.S. Cl. ........................ 257/410; 257/411; 257/344; 257/513
(58) Field of Search ................................. 257/410, 411, 257/408, 344, 513, 514, 515

(56) References Cited

U.S. PATENT DOCUMENTS

| 4,120,700 | 10/1978 | Morimoto | 148/1.5 |
|---|---|---|---|
| 4,559,096 | 12/1985 | Friedman et al. | 156/272.2 |
| 4,929,489 | 5/1990 | Dreschhoff et al. | 428/195 |
| 5,070,046 | 12/1991 | Hu | 501/9 |
| 5,111,355 | 5/1992 | Anand et al. | 361/313 |
| 5,142,438 | 8/1992 | Reinberg et al. | 361/313 |
| 5,186,718 | 2/1993 | Tepman et al. | 29/25.01 |
| 5,246,884 | 9/1993 | Jaso et al. | 437/225 |
| 5,281,554 | 1/1994 | Shimada et al. | 437/180 |
| 5,304,503 | 4/1994 | Yoon et al. | 437/43 |
| 5,552,337 | 9/1996 | Kwon et al. | 437/60 |
| 5,677,015 | 10/1997 | Hasegawa | 427/576 |
| 5,834,353 | 11/1998 | Wu | 438/287 |
| 5,874,766 | * 2/1999 | Hori | 257/410 |
| 6,004,850 | 12/1999 | Lucas et al. | 438/301 |
| 6,051,865 | * 4/2000 | Gardner et al. | 257/411 |

FOREIGN PATENT DOCUMENTS

| 0540993 | * 5/1993 | (EP) | 257/411 |
|---|---|---|---|
| 4-137562 | * 5/1992 | (JP) | 257/411 |

OTHER PUBLICATIONS

Yamada et al. "Gas Cluster Ion Beam Processing for ULSI Fabrication," Reprinted from Materials Reserch Society Symposium Proceedings vol. 427, *Advanced Metallization for Future ULSI*.

Raaijamakers "Low Temperature Metal—Organic Chemical Vapor Deposition of Advanced Barrier Layers for the Microelectronics Industry," *Thin Solid Films*, 247 (1994) pp. 85–93.

* cited by examiner

*Primary Examiner*—Steven Loke
(74) *Attorney, Agent, or Firm*—Kevin L. Daffer; Conley, Rose & Tayon

(57) ABSTRACT

A transistor is provided having a metal silicide gate spaced above a semiconductor substrate by a high-dielectric-constant ceramic gate dielectric. The entire gate conductor is preferably composed of a metal silicide. In an embodiment, the metal silicide is cobalt silicide and the ceramic gate dielectric is barium strontium titanate, lead lanthanum zirconate titanate barium zirconate titanate, cerium oxide, or tin oxide. In another embodiment, the ceramic gate dielectric has nitrogen atoms incorporated therein. The transistor may also include dielectric spacers adjacent opposed sidewall surfaces of the gate conductor, lightly doped drain regions arranged underneath the spacers, and source and drain regions arranged adjacent the lightly doped drain regions.

4 Claims, 5 Drawing Sheets

METAL SILICIDE TRANSISTOR GATE SPACED FROM A SEMICONDUCTOR SUBSTRATE BY A CERAMIC GATE DIELECTRIC HAVING A HIGH DIELECTRIC CONSTANT

BACKGROUND OF THE INVENTION

1. Field of the Invention

This invention relates to integrated circuit fabrication and, more particularly, to forming a transistor upon a semiconductor substrate in which the gate conductor comprises cobalt silicide and the gate dielectric comprises a ceramic having a relatively high dielectric constant.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Because of the increased desire to build faster and more complex integrated circuits, it has become necessary to reduce the transistor threshold voltage, $V_T$, while the transistor is in its on state. Several factors contribute to $V_T$, one of which is the gate-to-substrate capacitance. The higher the gate-to-substrate capacitance, the lower the $V_T$ of a transistor. The value of this capacitance is dependent upon the thickness of the gate oxide, and the relative permittivity of the gate oxide. Unfortunately, the relative permittivity, or dielectric constant, $\kappa$, of the gate oxide limits the amount of gate-to-substrate capacitance that can be achieved when a transistor is in operation. Permittivity, $\epsilon$, of a material reflects the ability of the material to be polarized by an electric field. The capacitance between two layers of conductive material separated by a dielectric is directly proportional to the permittivity of the dielectric. The permittivity of a material is typically described as its permittivity normalized to the permittivity of a vacuum, $\epsilon_o$. Hence, the relative permittivity or dielectric constant of a material is defined as:

$$\kappa = \epsilon/\epsilon_o$$

Since oxide (i.e., silicon dioxide) has a relatively low $\kappa$ of approximately 3.7 to 3.8, the minimum value of $V_T$, and thus the transistor switching speed must be somewhat sacrificed in order to promote capacitive coupling between the gate conductor and the substrate.

As mentioned above, the gate-to-substrate capacitance is also affected by the thickness of the gate oxide. Conventional transistors typically include an ultra thin gate oxide to reduce the gate-to-substrate capacitance, and thereby lower $V_T$. The value of the gate-to-source voltage, $V_{GS}$, required to invert the channel underneath the gate conductor such that a drive current, $I_D$, flows between the source and drain regions of the transistor is decreased. Consequently, the switching speed (from off to on and vice versa) of the logic gates of an integrated circuit employing such transistors is faster, allowing the integrated circuit to quickly transition between logic states (i.e., operate at high frequencies).

Unfortunately, thin oxide films may break down when subjected to an electric field. Particularly, for a gate oxide which is less than 50 Å thick, it is probable that when $V_{GS}$ is equivalent to only 3V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by e.g., dangling bonds. As a result, a net negative charge density may form in the gate oxide. As the trapped charge accumulates with time, $V_T$ may shift from its design specification. Breakdown of the gate oxide may also occur at even lower values of $V_{GS}$, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice. Low breakdown voltages also correlate with high defect density near the surface of the substrate.

It would therefore be desirable to develop a technique for fabricating a transistor with reduced gate-to-substrate capacitance which is substantially resistant to gate dielectric breakdown. Fabrication of a relatively thin gate oxide interposed between the gate and the substrate must be avoided. A transistor with the immediately preceding advantages must also switch on and off quickly, thereby providing for high frequency operation of an integrated circuit. Further, formation of a tunneling current between the gate dielectric and the gate conductor of the resulting transistor would be less likely. The possibility of electrons becoming trapped within the gate dielectric would also be reduced. The transistor would thus be substantially resistant to threshold skews from the desired value of $V_T$.

SUMMARY OF THE INVENTION

The problems outlined above are in large part solved by the technique hereof for fabricating a transistor in which the gate dielectric is composed of a ceramic having a relatively high dielectric constant, $\kappa$. The gate-to-substrate capacitance, being directly proportional to $\kappa$, is thus reduced, causing a decrease in the transistor threshold voltage, $V_T$. As a result, an integrated circuit employing such transistors can more quickly transition between logic states. Further, the reduction of the gate-to-substrate capacitance can be accomplished advantageously without resorting to decreasing the gate dielectric thickness. In other words, a thicker gate dielectric can be used to achieve the same $V_T$ as compared to using a gate dielectric composed of oxide. Therefore, the probability that the gate dielectric will breakdown is significantly reduced. In this manner, problems such as current passing through the gate dielectric and electron entrapment within the gate dielectric are less likely to be encountered.

The present invention further contemplates the formation of a gate conductor comprising metal silicide, preferably cobalt silicide, above the ceramic gate dielectric. The gate conductor is formed by depositing a layer of polysilicon across the gate dielectric and then cobalt across the polysilicon layer. The semiconductor topography is subjected to a one-step anneal to promote a reaction between cobalt atoms and silicon atoms within the polysilicon layer such that cobalt silicide forms. Preferably, the amount of polysilicon that is deposited is commensurate to that which is consumed. The resulting cobalt silicide gate conductor exhibits a relatively low sheet resistance which is lower than that of the conventional doped polysilicon gate conductor. Using a low resistivity cobalt silicide gate conductor provides for a lower $V_T$ value. Thus, the combination of a relatively high κ gate dielectric with a relatively low resistivity metal silicide gate conductor can be used to form faster operating integrated circuits.

According to one embodiment of the present invention, a semiconductor substrate is provided. The substrate may be placed in one chamber of a multi-chamber system to remove any residual oxide from the substrate. The oxide removal process first involves pumping down the chamber to a relatively low pressure, thereby forming a vacuum within the chamber. A plasma etch process is then performed to remove the oxide using an $NF_3$ and $N_2$ entrained gas. A robotics arm of the multi-chamber system is then used to move the semiconductor substrate to another chamber of the system while maintaining the substrate under vacuum. Thus, exposure of the substrate to ambient oxygen and other contaminants is prevented. While in the second chamber, a ceramic is sputtered from a ceramic target onto the semiconductor substrate to form a gate dielectric. The ceramic gate dielectric preferably has a relatively high dielectric constant of greater than approximately 3.8. Examples of ceramics having high κ are, e.g., barium strontium titanate, lead lanthanum zirconate titanate, barium zirconate titanate, cerium oxide, and tin oxide.

The ceramic gate dielectric may then be annealed while exposed to a nitrogen bearing ambient. In this manner, nitrogen atoms diffuse into and become incorporated within the gate dielectric. The nitrogen atoms fill vacancies, interstitial positions, and opportune bond sites within the gate dielectric. The nitrogen atoms occupy a substantial portion of the migration avenues at the substrate/oxide interface, and thus prevent high-energy carriers (electrons or holes) from being injected into the gate dielectric. Therefore, the hot carrier effect (HCE), which is a phenomena by which the kinetic energy of the charge carriers is increased as they are accelerated through large potential gradients and subsequently become trapped within the gate dielectric, is abated. Subsequent to the step of nitrogen incorporation into the gate dielectric, a polysilicon layer is preferably deposited using chemical vapor deposition ("CVD") across the ceramic gate dielectric. The surface of the polysilicon layer may then be polished to remove any surface irregularities.

Cobalt is deposited across the polysilicon layer using either physical vapor deposition ("PVD") or CVD. PVD of cobalt may involve sputtering the cobalt from a cobalt target. More specifically, CVD of cobalt may be performed using metal organic CVD ("MOCVD") in which the polysilicon layer is exposed to a gas containing a cobalt organic compound. The cobalt is then heated by placing the semiconductor topography in a high temperature furnace or by using Rapid Thermal Processing ("RTP"). As a result, cobalt atoms and silicon atoms of the polysilicon layer undergo cross-diffusion at the cobalt/polysilicon interface and react to form cobalt silicide. Preferably, a substantial portion of the polysilicon is consumed during this reaction, forming cobalt silicide directly above the ceramic gate dielectric.

Transistor formation may be completed by etching portions of the cobalt silicide and the ceramic gate dielectric down to the semiconductor substrate to define opposed sidewall surfaces of the gate conductor. A lightly doped drain ("LDD") implant which is self-aligned to the sidewall surfaces of the gate conductor may be forwarded into the substrate. Dielectric spacers are formed upon the sidewall surfaces of the gate conductor, and source/drain regions which are self-aligned to the exposed lateral surfaces of the spacers are implanted into the substrate.

BRIEF DESCRIPTION OF THE DRAWINGS

Other objects and advantages of the invention will become apparent upon reading the following detailed description and upon reference to the accompanying drawings in which:

FIG. 5 is a cross-sectional view of the semiconductor topography, wherein a polysilicon layer is deposited across the ceramic gate dielectric, subsequent to the step in FIG. 4a;

DETAILED DESCRIPTION OF THE INVENTION

Figure 1:
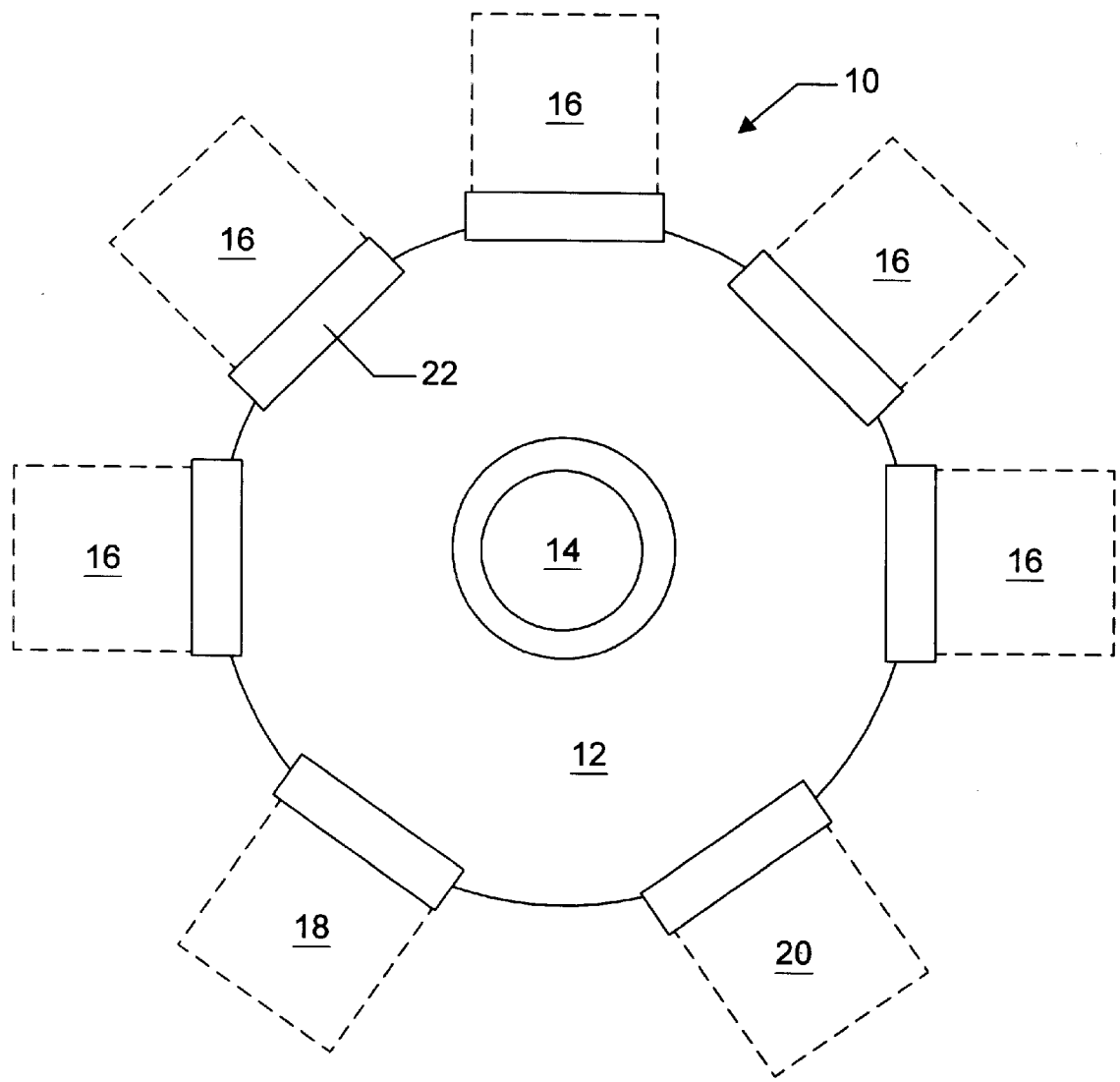
FIG. 1 is a top plan view of a multi-chamber semiconductor processing system.

Turning now to the drawings, FIG. 1 illustrates a multi-chamber vacuum system 10 which may be used to perform various semiconductor processes of the present invention. The multi-chamber system 10 includes a main chamber 12 within which a robotic arm 14 is disposed. The robotic arm 14 is capable of moving in various directions to carry semiconductor wafers to the different chambers 16 of the system. The robotic arm may pass through a port 22 into each chamber 16. Each port 22 may include a valve so that the chambers 16 may be isolated from main chamber 12 while processes are performed within the chambers. The types of semiconductor processes which may be carried out in chambers 16 include, but are not limited to, plasma etch, chemical vapor deposition, sputtering, and rapid thermal processing. Since multi-chamber vacuum system 10 is an enclosed system, the semiconductor wafers may be transferred between chambers 16 while maintained under vacuum. Thus, the multi-chamber system 10 can advantageously inhibit such wafers from being exposed to contaminating species in an ambient surrounding, or external to, system 10. The multi-chamber system 10 may also include a loading chamber 18 and unloading chamber 20 for holding the wafers prior to and after processing. System 10 may be used to perform some of the processing steps of the present invention.

Figure 2:
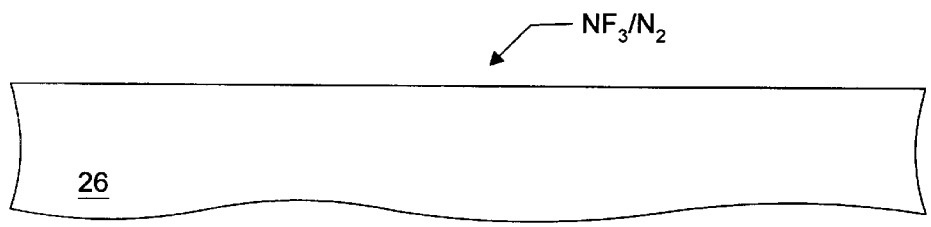
FIG. 2 is a cross-sectional view of a semiconductor topography, wherein any residual oxide is etched from a semiconductor substrate using a plasma formed from an $NF_3$ entrained gas.
Figure 3:
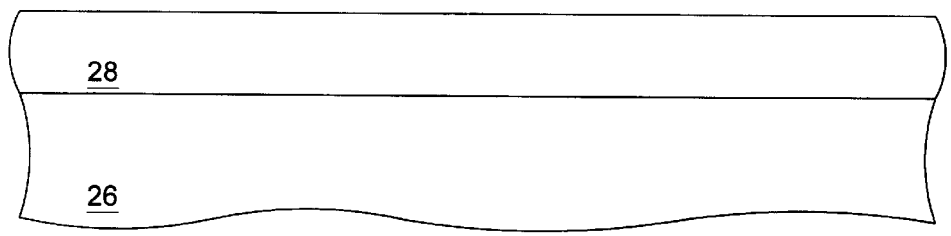
FIG. 3 is a cross-sectional view of the semiconductor topography, wherein a ceramic gate dielectric having a relatively high κ value is deposited across the semiconductor substrate, subsequent to the step in FIG. 2.

Turning to FIG. 2, a semiconductor substrate 26 is provided which may comprises single crystalline silicon. Although not shown in the depicted cross-section of substrate 26, dielectric isolation regions, such as trench isolation structures may be arranged spaced distances apart within the substrate for dielectrically isolating ensuing active areas. Semiconductor substrate 26 may be retrieved from loading chamber 18 and placed within one of the chambers 16 of multi-chamber system 10 shown in FIG. 1. Any unwanted oxide which may have formed upon substrate 26 is then removed using a plasma etch in which the plasma source is provided from an $NF_3$ and $N_2$ entrained vapor. While maintaining substrate 26 under vacuum, and thereby protecting the substrate from ambient oxygen and other contaminants, substrate 26 is moved to another of the chambers 16. A gate dielectric 28 comprising a ceramic having a relatively high κ value may then be formed across substrate 26 using, e.g., sputter deposition from a ceramic target. The κ value of the ceramic is preferably greater than about 3.8. Suitable ceramics which have relatively high κ values are, e.g., barium strontium titanate (BST), lead lanthanum zirconate titanate (PLZT), barium zirconate titanate (BZT), cerium oxide (CEO2), and tin oxide (TiO). The thickness of gate dielectric 28 may vary from about 200 Å to 1,000 Å, depending upon the dielectric constant of the ceramic as well as other properties of the ceramic. As discussed previously, the higher the dielectric constant, the lower the threshold voltage of the ensuing transistor.

Figure 4A:
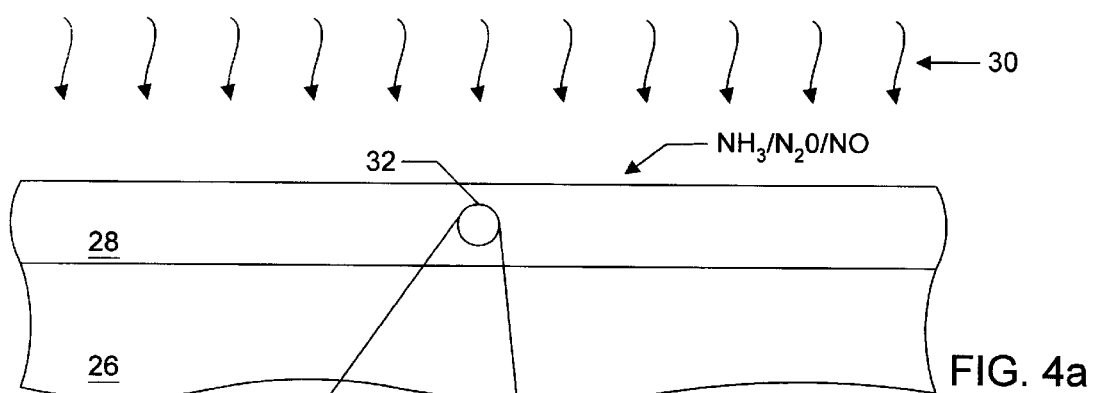
FIG. 4a is a cross-sectional view of the semiconductor topography, wherein the ceramic gate dielectric is annealed in a nitrogen bearing ambient, subsequent to the step in FIG. 3.
Figure 4B:
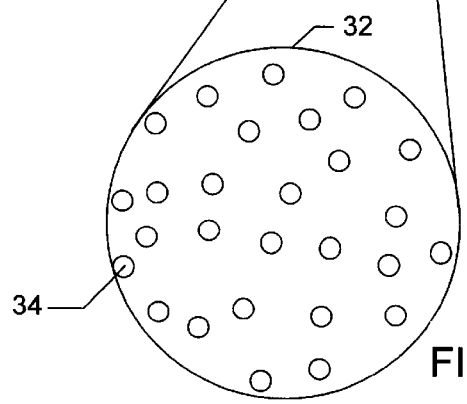
FIG. 4b is a detailed view along section 32 of FIG. 4a, wherein nitrogen atoms are incorporated into the ceramic gate dielectric.

As shown in FIG. 4a, the semiconductor topography may then be exposed to thermal radiation 30 while in a nitrogen bearing ambient. Nitrogen may be sourced from either $NH_3$, $N_2O$, or NO gas. In this manner, nitrogen atoms diffuse into gate dielectric 28 where they fill vacancy and interstitial positions. FIG. 4b depicts a detailed view along section 32 of FIG. 4a. Nitrogen atoms 34 are incorporated throughout gate dielectric 28. The nitrogen atoms 34 may later serve to block migration avenues into gate dielectric 28 such that hot electron carriers and foreign atoms cannot pass into the gate dielectric during operation or fabrication of the ensuing transistor. Further, the presence of nitrogen atoms 34 occupies sites which foreign atoms and/or molecules could have otherwise filled. The nitrogen bond is believed to be sufficiently strong so as to prevent unwanted bonds from electrically deleterious contaminants.

Figure 5:
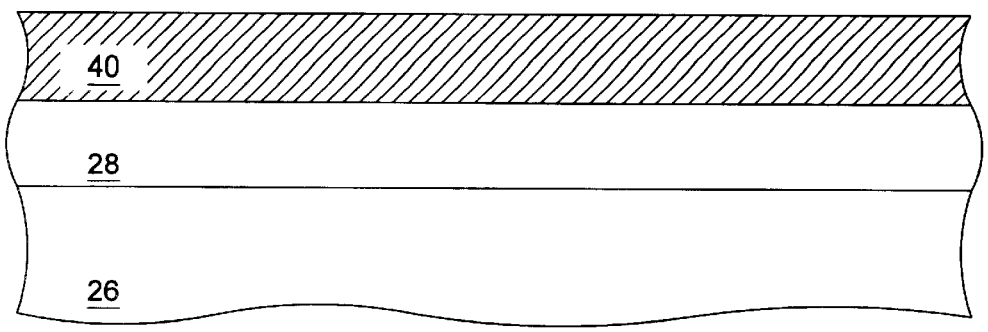
Figure 6:
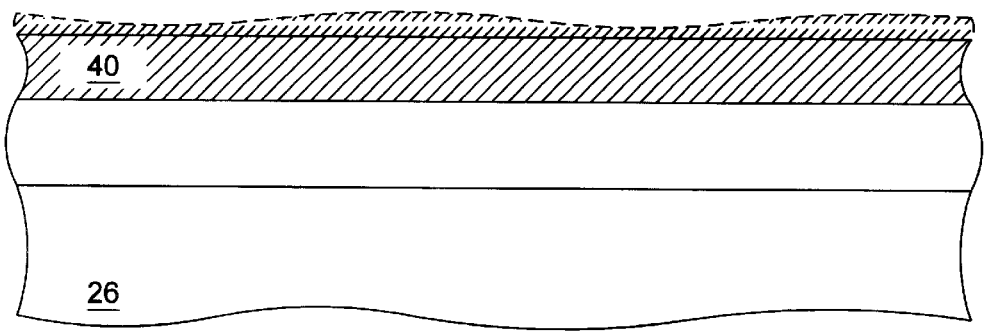
FIG. 6 is a cross-sectional view of the semiconductor topography, wherein the polysilicon layer is polished to remove surface irregularities, subsequent to the step in FIG. 5.
Figure 7:
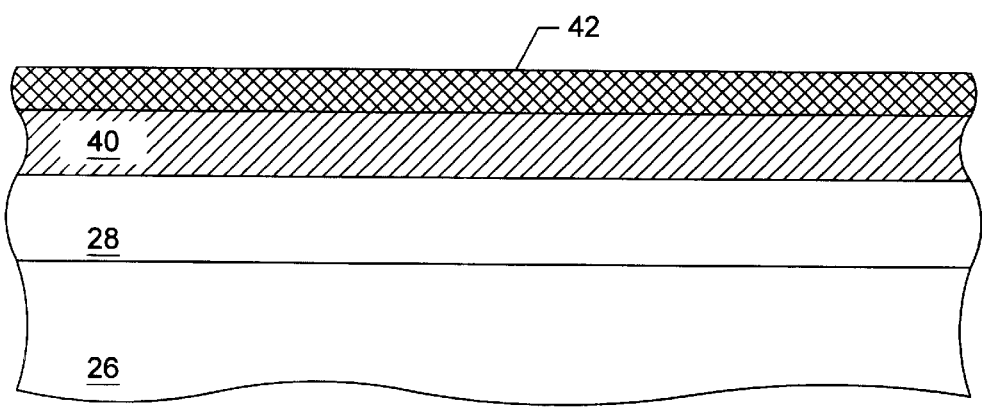
FIG. 7 is a cross-sectional view of the semiconductor topography, wherein cobalt is deposited across the polysilicon layer, subsequent to the step in FIG. 6.

Turning to FIG. 5, a polysilicon layer 40 may be formed across ceramic gate dielectric 28 by using chemical vapor deposition ("CVD") of polysilicon from e.g., a silane source. The polysilicon layer 40 is preferably deposited to a thickness of approximately 100 to 150 Å. The upper surface of polysilicon layer 40 may then be polished using e.g., mechanical polishing or chemical-mechanical polishing to substantially reduce its surface roughness, as shown in FIG. 6. As a result, the thickness of polysilicon layer 40 may be reduced by about 50 Å to a uniform thickness across the dielectric surface. As illustrated in FIG. 7, a refractory metal 42 may be formed across polysilicon layer 40. Preferably, refractory metal 42 is cobalt which can be sputter deposited from a cobalt target or MOCVD deposited from a source comprising a volatile cobalt organic compound. One metal organic compound which may be used for the MOCVD of cobalt is cobalt nitrosyl tricarbonyl.

Figure 8:
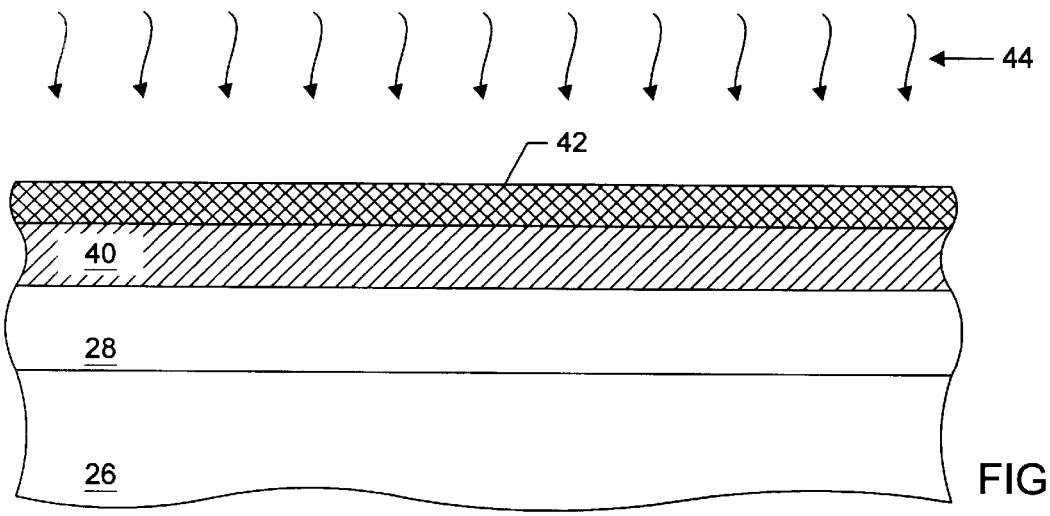
FIG. 8 is a cross-sectional view of the semiconductor topography, wherein the cobalt is heated to initiate reaction of the cobalt with silicon atoms of the polysilicon layer to form cobalt silicide, subsequent to the step in FIG. 7.
Figure 9:
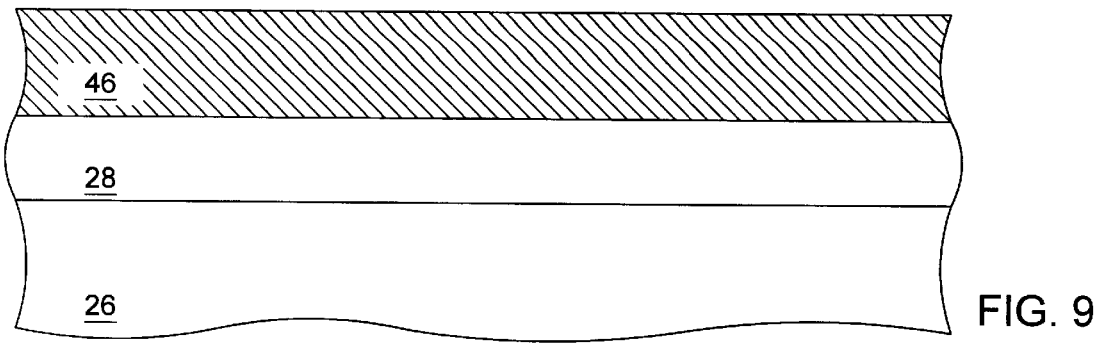
FIG. 9 is cross-sectional view of the semiconductor topography, wherein a cobalt silicide gate conductor is formed across the ceramic gate dielectric while the cobalt and the polysilicon layer are consumed, subsequent to the step in FIG. 8.

Subsequently, cobalt layer 42 may be heated to a temperature of approximately 700° C. by exposing it to a form of radiation 44, as depicted in FIG. 8. Radiation 44 may be thermal radiation provided from a heated furnace. Alternately, radiation 44 may be radiant light supplied from e.g., an arc lamp or a tungsten-halogen lamp using a technique known as rapid thermal processing ("RTP"). The use of RTP to heat cobalt layer 42 may reduce the amount of unwanted dopant diffusion into the semiconductor topography as compared to using a high temperature furnace. Raising the temperature of cobalt layer 42 serves to initiate reaction between cobalt atoms and silicon atoms of polysilicon layer 40 to form cobalt silicide 46. As shown in FIG. 9, a cobalt silicide layer 46 may result which is arranged directly above the surface of gate dielectric 28. Preferably, polysilicon layer 40 and cobalt layer 42 are completely consumed. The ratio of the amount of each of these layers formed can be controlled such that nearly complete consumption is possible. This ratio may be based upon the fact that about 2 moles of silicon are consumed for every mole of cobalt consumed at room temperature. If any cobalt happens to remain, it may be removed using e.g., a selective wet etch which does not affect the cobalt silicide ($CoSi_2$). $CoSi_2$ is beneficial in that it has a relatively low resistivity and high temperature stability, making for a good gate conductor material.

Figure 10:
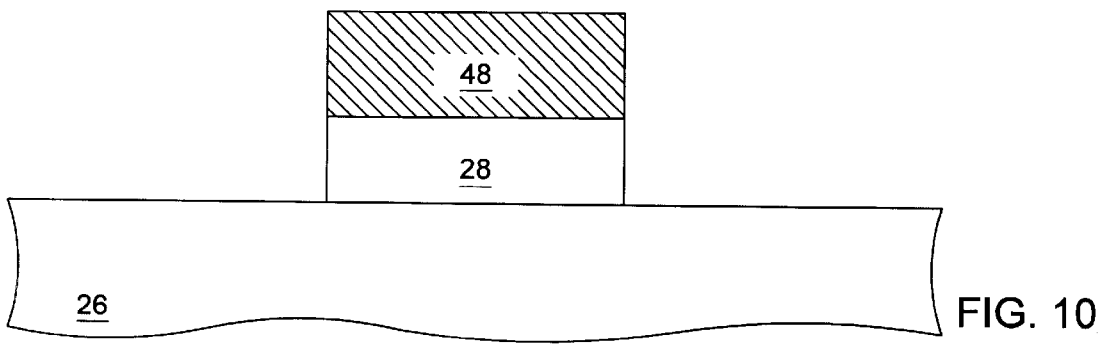
FIG. 10 is a cross-sectional view of the semiconductor topography, wherein portions of the cobalt silicide gate conductor and the ceramic gate dielectric are removed to define opposed sidewall surfaces of the gate conductor, subsequent to the step in FIG. 9.
Figure 11:
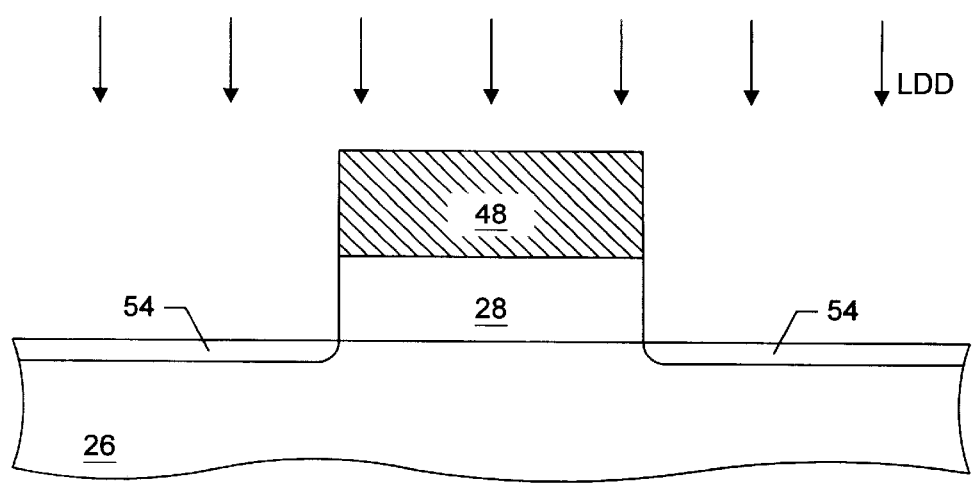
FIG. 11 is cross-sectional view of the semiconductor topography, wherein an LDD implant which is self-aligned to the opposed sidewall surfaces of the gate conductor is forwarded to the semiconductor topography, subsequent to the step in FIG. 10.

Turning to FIG. 10, portions of ceramic gate dielectric 28 and cobalt silicide 46 may be removed to form a gate conductor 48 defined between a pair of opposed sidewall surfaces. Removal of those portions may involve using optical lithography and a plasma etch which is terminated before substantial portions of the surface of substrate 26 are removed. As shown in FIG. 11, an LDD implant may then be forwarded to semiconductor substrate 26. The LDD implant is aligned to the opposed sidewall surfaces of gate conductor 48, and thereby leads to the formation of LDD areas 54 within regions of substrate 48 not masked by gate conductor 48 and exclusive of isolation regions. The LDD areas 54 preferably contain a light concentration of dopants that are opposite in type to the dopants implanted within the bulk of substrate 54.

Figure 12:
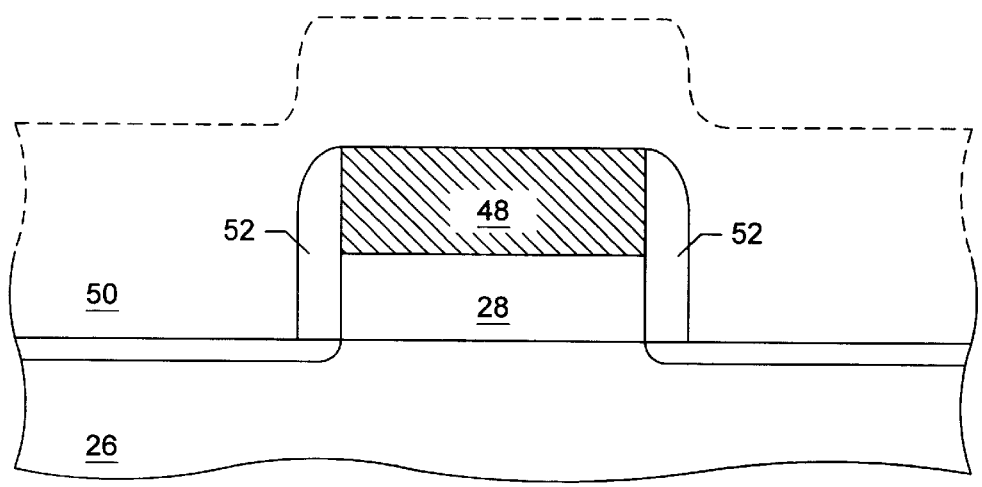
FIG. 12 is a cross-sectional view of the semiconductor topography, wherein dielectric spacers are formed upon the opposed sidewall surfaces of the gate conductor, subsequent to the step in FIG. 11.
Figure 13:
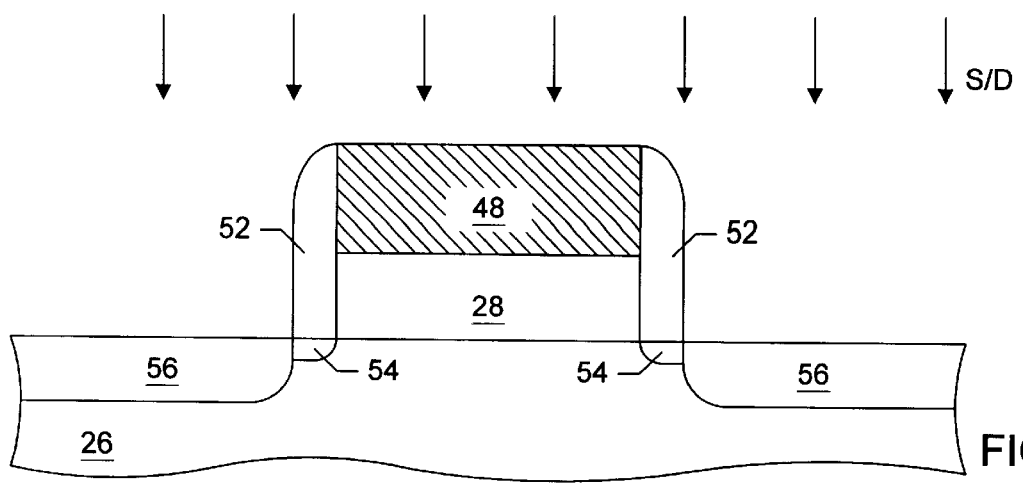
FIG. 13 is a cross-sectional view of the semiconductor topography, wherein a source/drain implant which is self-aligned to the exposed lateral surfaces of the dielectric spacers is forwarded to the second semiconductor topography, subsequent to the step in FIG. 12.

Turning to FIG. 12, a dielectric material, such as oxide or nitride, may then be CVD deposited across exposed portions of substrate 26 and gate conductor 48. An anisotropic etch in which ion ablation occurs more quickly upon horizontal surfaces than vertical surfaces may then be performed to remove portion 50 of the dielectric material. Dielectric spacers 52 are thusly formed upon the opposed sidewalls surfaces of gate conductor 48. Subsequently, a heavy concentration source/drain ("S/D") implant is self-aligned to the exposed lateral surfaces of dielectric spacers 52, as shown in FIG. 13. During this implantation step, dopants are also forwarded into gate conductors 48 such that the conductivity of the gate conductor is increased. The dopants used for the S/D implant are of the same type as those used for the LDD implant. Preferably, if a PMOSFET transistor is being formed, ion implantation of p-type species is performed. On the other hand, if an NMOSFET transistor is being formed, n-type species are implanted into substrate 26. Some commonly used n-type dopants are arsenic or phosphorus, and some commonly used p-type dopants are boron or boron difluoride. The resulting transistor has graded junctions in which dopant concentration increases laterally in a direction away from gate conductor 48. In other words, S/D regions 56 are formed within semiconductor substrate 26 which are more heavily concentrated with dopants than LDD areas 54. The transistor has a relatively thick gate dielectric with a relatively high κ value such that it provides good gate-to-substrate capacitive coupling without breakdown problems.

It will be appreciated to those skilled in the art having the benefit of this disclosure that this invention is believed to provide a method for forming a transistor in which the gate dielectric is composed of a relatively high κ ceramic. Further modifications and alternative embodiments of various aspects of the invention will be apparent to those skilled in the art in view of this description. For example, multiple transistors may be formed upon and within the semiconductor substrate between isolation regions, contacts may be made to the transistors, and interconnect routing isolated above the transistors may be formed between the contacts.

It is intended that the following claims be interpreted to embrace all such modifications and changes and, accordingly, the specification and drawings are to be regarded in an illustrative rather than a restrictive sense.

What is claimed is:

1. A transistor, comprising:

a ceramic gate dielectric having a dielectric constant greater than approximately 3.8 disposed across a semiconductor substrate, wherein said ceramic gate dielectric comprises a ceramic selected from the group consisting of barium strontium titanate, lead lanthanum zirconate titanate, barium zirconate titanate, cerium oxide, and tin oxide, and wherein said ceramic gate dielectric comprises nitrogen atoms incorporated therein; and a metal silicide gate conductor disposed across said ceramic gate dielectric.

2. The transistor of claim 1, wherein said ceramic gate dielectric is approximately 200 to 1,000 Å thick.

3. The transistor of claim 1, wherein said metal silicide gate conductor comprises cobalt silicide.

4. The transistor of claim 1, further comprising:

a pair of dielectric spacers arranged upon opposed sidewall surfaces of said metal silicide gate conductor;

lightly doped drain areas arranged within said semiconductor substrate directly underneath said pair of dielectric spacers;

source and drain regions arranged within said semiconductor substrate directly laterally adjacent to said lightly doped drain areas; and trench isolation structures arranged within said semiconductor substrate directly laterally adjacent to said source and drain regions.

* * * * *